US007041990B2

(12) United States Patent
Kim et al.

(10) Patent No.: US 7,041,990 B2
(45) Date of Patent: May 9, 2006

(54) APPARATUS FOR MONITORING ION-IMPLANTATION INPUT PARAMETER IN SEMICONDUCTOR FABRICATING DEVICES AND MONITORING METHOD THEREOF

(75) Inventors: Jong-Pyo Kim, Seoul (KR); Mun-Hee Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/185,553

(22) Filed: Jun. 27, 2002

(65) Prior Publication Data

US 2003/0001111 A1  Jan. 2, 2003

(30) Foreign Application Priority Data

Jun. 29, 2001  (KR)  ............................... 2001-38017

(51) Int. Cl.
*G21K 5/10*  (2006.01)

(52) U.S. Cl. ............................... 250/492.21; 250/492.3; 250/492.1

(58) Field of Classification Search ............. 250/492.1, 250/492.3, 492.21; 707/104
See application file for complete search history.

(56) References Cited

U.S. PATENT DOCUMENTS

| | | | |
|---|---|---|---|
| 4,805,089 A * | 2/1989 | Lane et al. ................... 700/83 |
| 5,475,618 A | 12/1995 | Le | |
| 5,822,717 A * | 10/1998 | Tsiang et al. ................ 702/108 |
| 5,923,533 A * | 7/1999 | Olson .......................... 361/699 |
| 5,940,300 A * | 8/1999 | Ozaki .......................... 700/121 |
| 6,065,074 A * | 5/2000 | Minamizawa ................ 710/54 |
| 6,148,307 A * | 11/2000 | Burdick et al. ........... 707/104.1 |
| 6,169,015 B1 * | 1/2001 | Fu-Kang ..................... 438/510 |
| 6,240,427 B1 * | 5/2001 | Szalwinski et al. ......... 707/204 |
| 6,446,022 B1 * | 9/2002 | Coss et al. .................. 702/121 |
| 6,460,002 B1 * | 10/2002 | Bone et al. .................... 702/81 |

* cited by examiner

*Primary Examiner*—Nikita Wells
*Assistant Examiner*—Anthony Quash
(74) *Attorney, Agent, or Firm*—Marger Johnson & McCollom, P.C.

(57) ABSTRACT

An input parameter monitoring apparatus is disclosed wherein input parameters for ion implantation can be stored in a database during an ion implantation process, thereby allowing a user to monitor the operational history from a remote location. A method of monitoring input parameters created during an ion implantation process in a semiconductor fabricating device includes collecting log data generated by a plurality of ion implantation devices, listing the collected log data in a database in chronological order and updating the database substantially contemporaneously during said process. The log data can be processed to enable textual or graphical display. A LAN connects a local computer connected via input ports to plural ion-imp devices and a remote computer, thereby enabling remote computer monitoring of the operational process and possibly interaction.

16 Claims, 4 Drawing Sheets

APPARATUS FOR MONITORING ION-IMPLANTATION INPUT PARAMETER IN SEMICONDUCTOR FABRICATING DEVICES AND MONITORING METHOD THEREOF

BACKGROUND OF THE INVENTION

The present invention relates to an apparatus for monitoring input parameters of ion-implantation in semiconductor fabricating devices and a monitoring method thereof, and more particularly to an apparatus and method by which input parameters can be remotely monitored during the ion-implantation process of semiconductor fabricating devices.

Generally, an ion-implantation process involves transforming p-type impurities having three valence electrons (e.g., boron, aluminum, indium) and n-type impurities having five valence electrons (e.g., antimony, phosphorus, arsenic) into a plasma ion beam state. These impurities are thereafter ion-implanted into a semiconductor crystal (e.g., a silicon (Si) wafer) to obtain a conductivity-type, or a non-resistance, device.

An ion implantation device for performing such an ion-implantation process is disclosed in U.S. Pat. No. 5,475,618 (to Le). The LE ion implantation device can control the concentration of the selected impurity in the range of $10^{14}$–$11^{18}$ atom/cm$^3$. Ion implantation devices have been widely used as the integration degree increases, since the ion implantation device advantageously can more easily control the concentration of the impurity and more accurately control the depth of ion implantation than is possible with other impurity implantation techniques (e.g., diffusion).

Since a conventional ion implantation device requires that operation records be controlled and the details thereof be reviewed, a user undertakes such operational history review by outputting the details through a printer connected to the ion implantation device. However, this limitation means that the user heretofore must move to a working site where the apparatus is positioned and directly search and check the printed details in order to repair, control, or maintain the equipment.

Additionally, it is generally not possible to accurately monitor the device state with only the printed details. Instead, such details are used to confirm data when a problem with the apparatus is detected. The user therefore is also required to manually search and analyze data, thereby expending time and producing a great volume of paper.

SUMMARY OF THE INVENTION

The present disclosure provides an input parameter monitoring apparatus and a monitoring method thereof by which input parameters for ion implantation can be stored in a database in an ion implantation apparatus during an ion implantation process, thereby allowing a user to overview the entire operational history. Because the apparatus and monitoring method do not need to print operational history details during the ion implantation process, a great volume of paper need not be expended.

The invented input parameter monitoring system comprises a local computer having coupled thereto a first monitor adapted to display graphic data and text data and a plurality of ion implantation devices communicating with said local computer. Each of the devices include output ports. The local computer is operative to convert ion implantation process log data into text data and store the text data in a database concurrently to graphically process the log data and store the graphic data in a database, and to output the stored graphic data and text data.

The system can further include a remote computer operative to collect graphic data and text data input from the local computer through a local-area network and a second monitor coupled to said remote computer and adapted to display said graphic data and text data. The local computer and remote computer can communicate via a local-area network or equivalent means.

In the monitoring method disclosed herein, input parameters are collected and stored in a database during an ion implantation process involving a plurality of ion implantation devices, thus to enable remote monitoring of the process and devices. The method comprises collecting log data generated by at least one of a plurality of ion implantation devices during said process. The collected log data is listed in a database in chronological order and the database is substantially contemporaneously during said process. The collected log data can be processed to generate processed text data and processed graphic data for display to a user.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS

Figure 1:
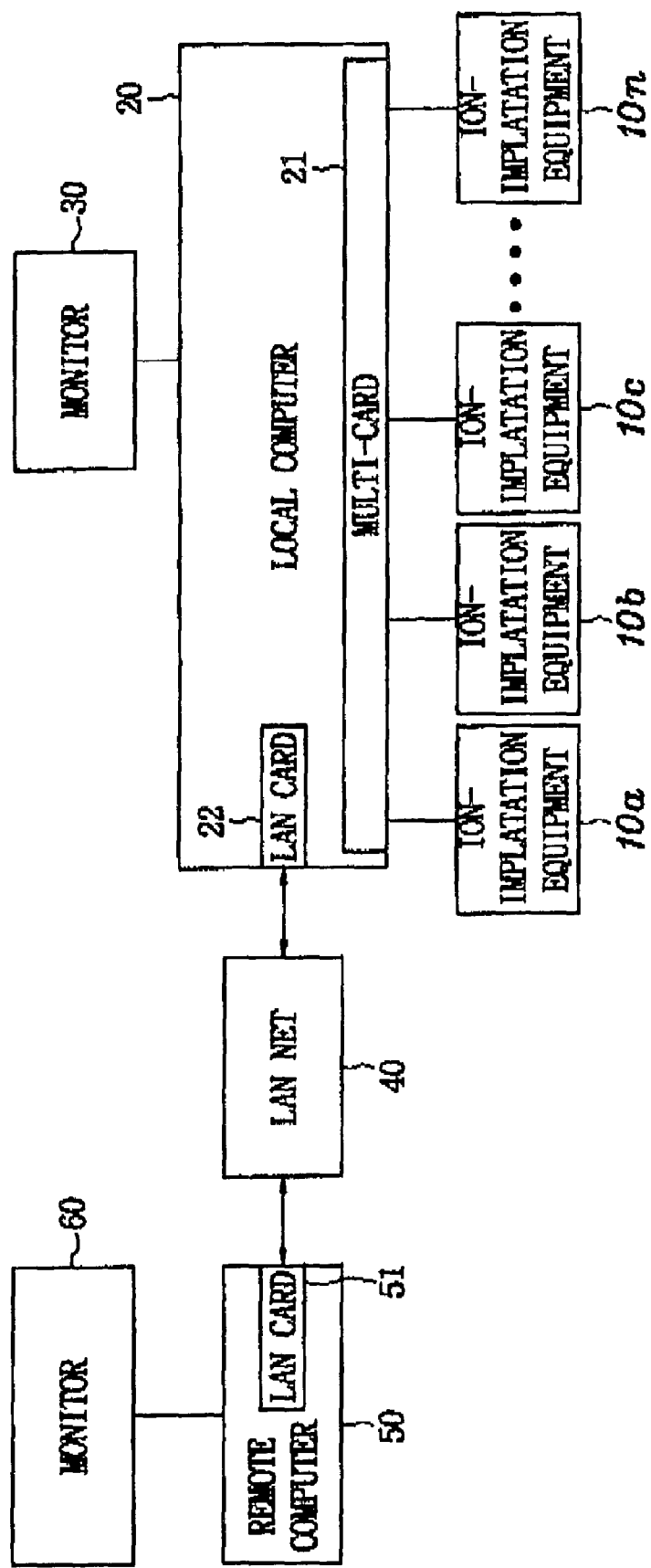
FIG. 1 is a schematic block diagram showing the structure of an input parameter monitoring system for ion-implantation according to an embodiment of the present invention.

Hereinafter, the present invention will be described in detail with reference to the accompanying drawings. It should be noted that, for simplicity of illustration and explanation, like reference numerals are used through the accompanying drawings for designation of like or equivalent parts or portions thereof.

Also, in the following description, specifications will be described to provide a more thorough understanding of the present invention. However, it will be apparent to one skilled in the art that the present invention can be achieved without the particular specifications described. There will be omission of detailed description about well-known functions and structures in order to avoid unnecessarily obscuring key points of the present invention.

FIG. 1 is a block diagram showing the structure of an input parameter monitoring system for ion implantation according to an embodiment of the present invention.

The monitoring system comprises a plurality of ion implantation devices 10a,10b, . . . ,10n for outputting input parameters to output ports during an ion implantation process.

The local computer 20 comprises a multi-card 21 interfacing the plurality of ion implantation devices 10a,10b, . . . ,10n to collect the input parameters that are outputted from the ion implantation devices.

Local computer 20 separately collects log data output from the output ports of the plurality of ion implantation devices 10a,10b, . . . ,10n. The local computer is operative to convert the log data for each process into text data for storage in one or more databases. The local computer is capable also of processing graphic data stored in databases, and also outputting stored graphic data and text data.

A first monitor 30 is coupled to the local computer 20 and can display graphic data and text data from the local computer.

A remote computer 50 is further included for collecting and outputting graphic data and text data from the local computer 20 through a local-area network (LAN) 40. The remote computer 50 is provided therein with a LAN card 51 for communicating with the local computer 20 through the LAN 40 utilizing any suitable protocol, e.g. a TCP/IP protocol.

A second monitor 60, coupled to the remote computer 50, is operative to display the graphic data and the text data from the remote computer.

In the embodiment illustrated, the local computer further comprises a LAN card 22 communicating with the remote computer 50 through the LAN 40. Other modalities for communicating over a network can be substituted and are well-known in the art.

Figure 2:
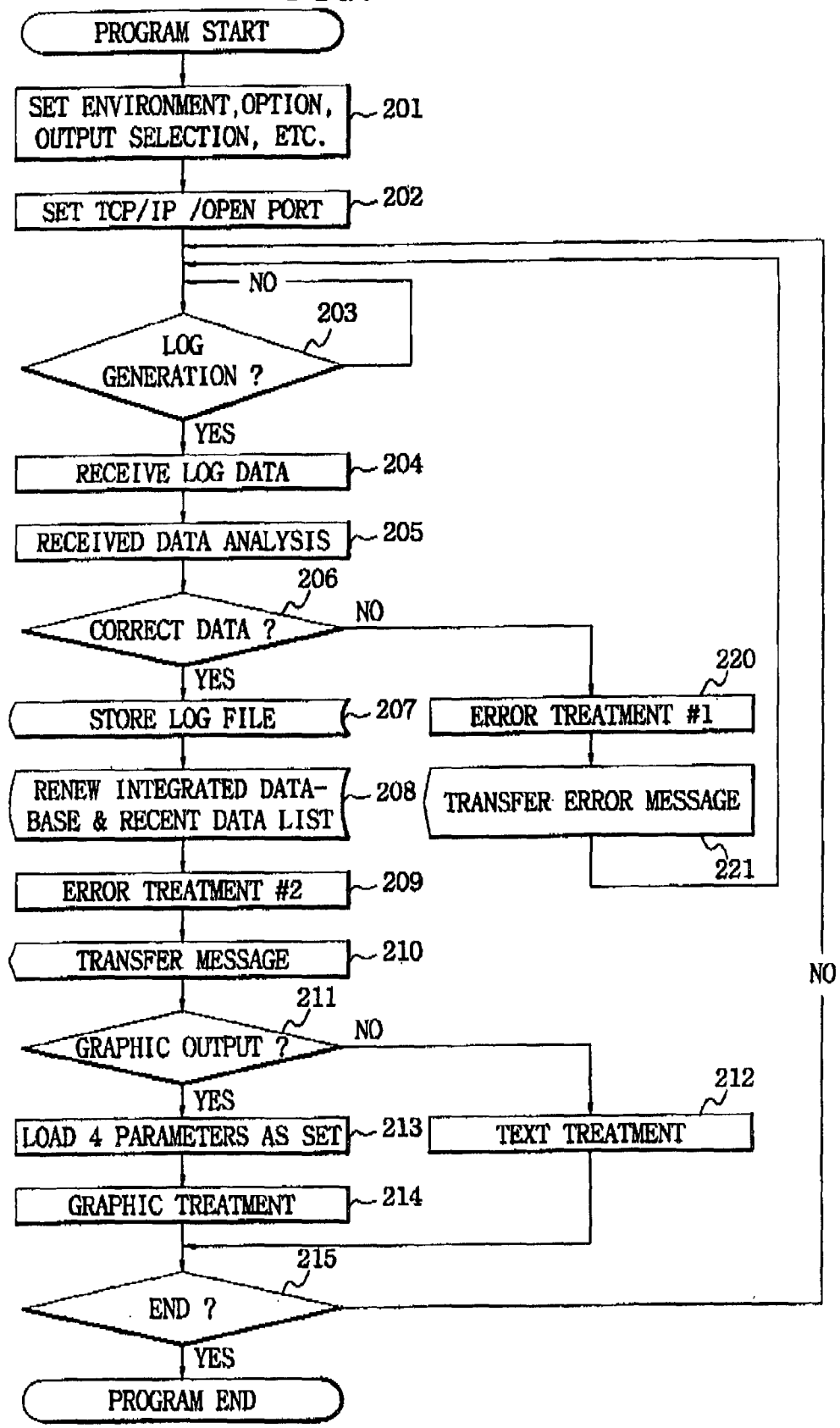
FIG. 2 is a flowchart showing the processes in a local computer for monitoring input parameters for ion-implantation according to the present invention.
Figure 3:
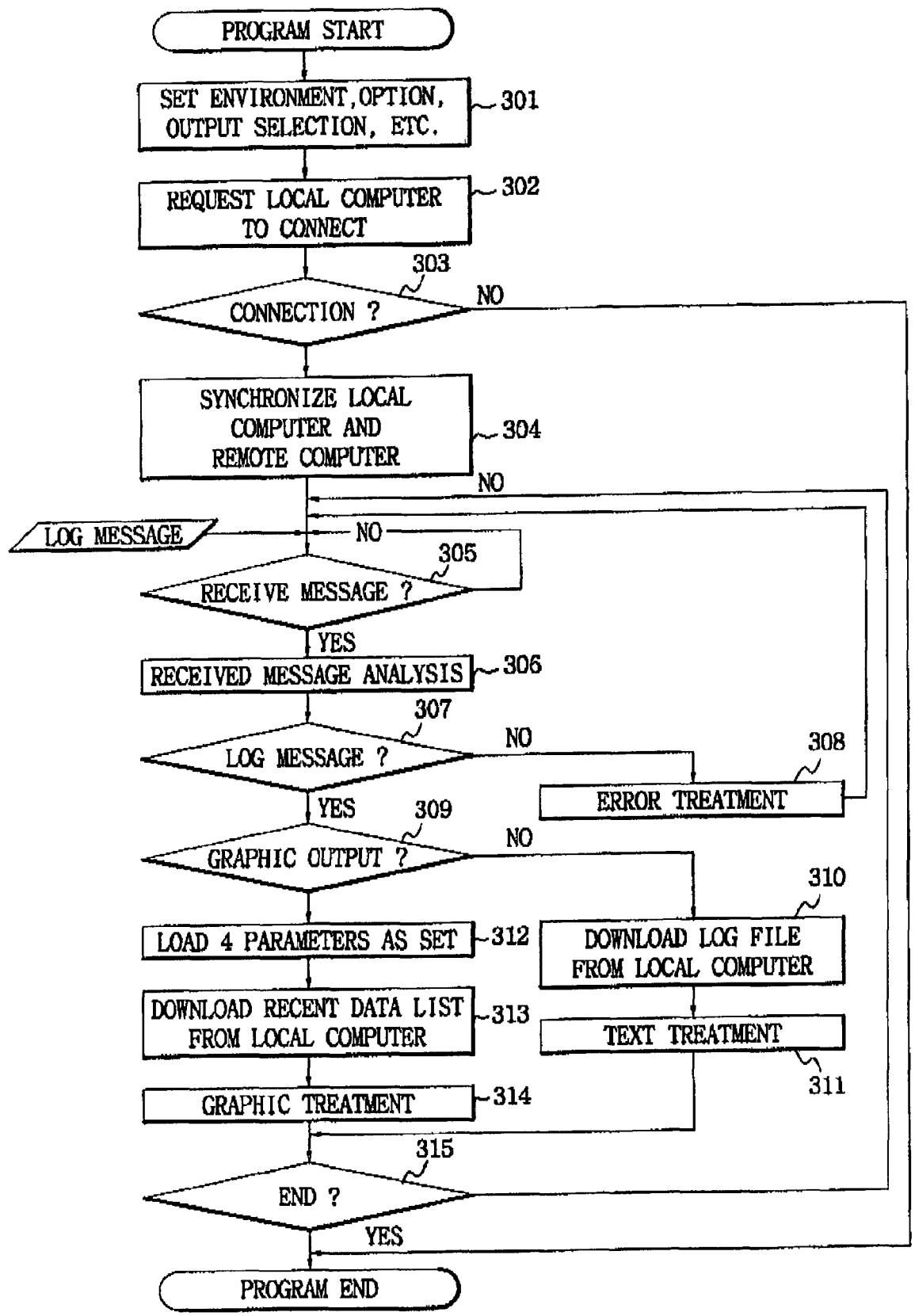
FIG. 3 is a flowchart showing the processes in a remote computer for monitoring input parameters for ion-implantation according to the present invention.

FIG. 2 is a flowchart showing the processes in a local computer for monitoring input parameters for ion-implantation according to the present invention. FIG. 3 is a flowchart showing the processes in a remote computer for monitoring input parameters for ion-implantation according to the present invention.

Figure 4:
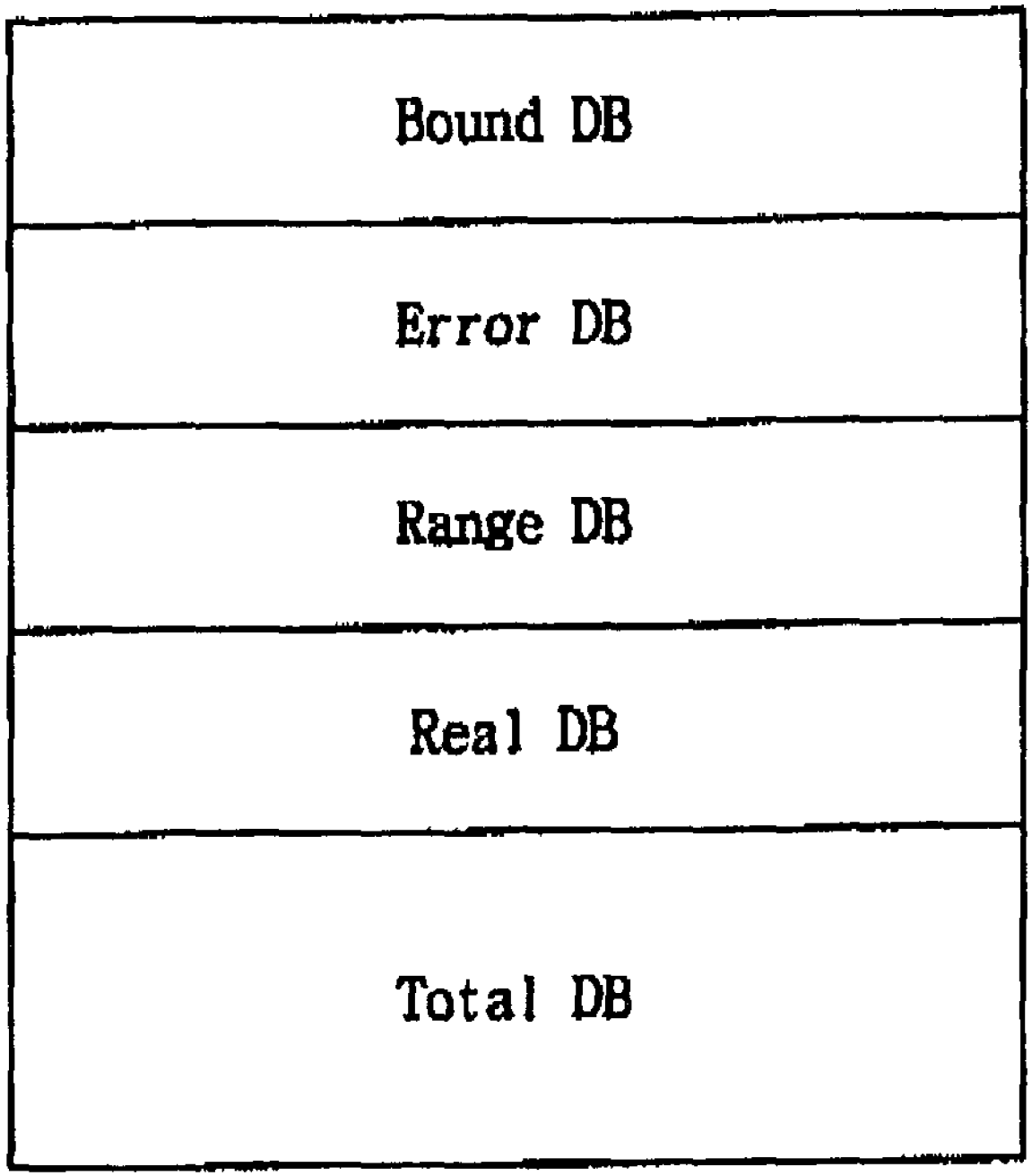
FIG. 4 is a diagram showing how a database can be structured according to an embodiment of the present invention.

FIG. 4 shows the structure of a representative database, in which Bound DB is a database for setting the boundary value of each of parameters; Error DB is a database for errors added when the log is created; Range DB is a database for setting the graph range; Real DB is a database for real time graph; and Total DB is a database for storing all parameters. The various contents are discussed more fully below.

The operation according to an embodiment will be explained with reference to FIGS. 1 to 3. First, ion implantation log system software programs in the local computer 20 and the remote computer 50 are initialized, and environment and output options are selected (steps 201, 301). At this time, the maximum and minimum values in the graphs and the highest limit and lowest limit values in the collected data are set.

In steps 201–202 and 301–303, the TCP/IP protocol is set and the LAN port is opened for communication between the local computer and the remote computer. Such connection schemes are known in the art.

In step 304, the local computer 20 and the remote computer 50 are synchronized. Thereafter, the plurality of ion implantation devices 10a,10b, . . . ,10n are engaged to perform the ion implantation processes and substantially simultaneously output the results as working and log data, to reflect the device state, through LAN 40.

The actions of the local computer are now described in more detail. In step 203, the local computer 20 then searches log data that are input through the multicard 21 to thereby check whether log data are generated.

If log data are generated, the local computer 20 stores the log data received in an extra buffer (step 204), then analyzes the log data received (step 205).

In step 206, the local computer 200 checks whether end-of-file (EOF) data are detected for a predetermined period. If the EOF data are not detected for a predetermined time, the received data are treated as an error (step 220), the local computer 20 displays the error message on the monitor 300 and at the same time transfers the message to the remote computer 50 through the LAN 40 (step 221), thereafter returning to step 203.

In step 206, if the EOF data are detected within a predetermined time, the received data are taken as correct data and a folder is created for storing the log file (step 207), by utilizing the time in the file name. At this time, the log file is stored as a monthly folder name. Each of the monthly folders contains daily folders.

Each file preferably is named to reflect its contents. For example, consider a file pertaining to device 10a parameters during a process on Dec. 14, 2000. In this example, further assume that the time that parameter data was received was 11:36:45 AM on Dec. 14, 2000. The file would be named "200012W20001214W1-20001214113645.DAT", corresponding to parameter data relevant to device #1 received at 11:36:45 AM on Dec. 14, 2000.

The folders can comprise DELETED LOG FILE, LOG, and MERGER FILE. The DELETED LOG FILE is a folder that is temporarily stored when the log is deleted. The LOG is a folder for storing a log file, and the MERGE FILE is a folder for Log Merge. The MERGE FILE is a function by which various events can be combined into one file at a desired time.

In step 208, the local computer 20 reads the stored log data, thereby to update the log data in accordance with the Total DB database (FIG. 4) and also to update the log data to reflect the most recent data.

In step 209, the local computer 20 performs processing (treatment) and outputs the updated message to the remote computer 50. An anomaly will be understood to include any predetermined process condition worthy of reporting to a user, e.g. wherein a process parameter is out of a predefined bound.

If text mode has been selected, the data will be treated as text. In step 212, the local computer 20 performs a text processing, or text treatment, regarding data in the list of recent data, displaying the results on the monitor 30.

If the local computer 20 is in graphic mode in step 211, it loads parameter data as a set into a database (step 213). In step 214, the local computer 20 performs graphic processing, in real-time, of the loaded parameter data. The local computer then graphically displays the results on the monitor 30.

At this time, the graphs calculated in a range set by the RANGE DB database are stored as a BMP file. If data for the devices are beyond the scope of the graph, values corresponding to the data are checked through printing, extending the graph function, and a scrolling function for the graph. Graphs are processed according to priority, receiving time and device.

An automatic calculation can be performed a predetermined number of times to thereby calculate the log data values that are first received according to predetermined conditions. The scope of the graph can be thereby estimated in accordance with an average of the log values—for example, in the range of ±5%. Alternatively, the maximum and minimum values for the graphs can be set by a user.

The values for all ion implantation devices can be set or calibrated to a representative ion implantation device. In addition, trend analysis may be performed on the data and the results can be displayed together with the occurrence or instantiation history, as is known.

After such predetermined number of parameters are graphically processed, the system determines whether the implantation process has terminated or is continuing (step 215). If the ion implantation process is continued, the process returns to step 203 and proceeds therefrom.

Turning now to the remote computer 50, in step 305, the remote computer checks whether data were received. If so, the remote computer 50 checks (step 306) whether the received message is a log message (step 307). If not, the remote computer 50 treats the received message as an error (error processing, step 308) and returns to step 306. If the received message is a log message, the remote computer 50 again checks (step 309) whether it is in graphic output mode.

If it is not a graphic output mode, the remote computer 500 downloads a log file (step 310) from the local computer 20 through the LAN 40. The remote computer 50 then performs a text processing (text treatment) of the downloaded log message and displays the results on the monitor 30 as text (step 311).

If a graphic mode has been selected, however, the remote computer 50 loads a predetermined number of parameters (step 309) as a set for graphic processing. The remote computer 50 then downloads a list of recent data (step 313) from the local computer 200 through the LAN 40.

The recent data may include any suitable parameters and groups of parameters; data fields can include beam energy, beam line pressure, arc current, extraction voltage, analyzer magnet field, source magnet field, suppression voltage, scan balance, station pressure, arc voltage, source voltage, angle corrector field, filament current, extraction current, scan amplitude, source pressure, suppression current, or beam current.

The downloaded recent data are then graphically processed (step 314) in real-time and the results displayed on the monitor 6 (FIG. 1). Those data are graphically processed and stored. The remote computer 50 then determines whether the implantation process has terminated or is continuing (step 315), as is done similarly by the local computer (see step 215, above).

As described above, after the graphic processing or text processing for the parameters, the remote computer 50 or the local computer 20 can search the parameters, for example for parameters relating to a specific device or a group of devices; times; process conditions (e.g., Dopant, Energy, Dose); and the like. The process conditions can be set by inputting predetermined values for specific parameters.

In a search mode, a user can input a search condition, such as one or more device or process parameters. In one embodiment, a search parameter can be selected via corresponding search icons, texts or graphics displayed on a screen. A user thus may make decisions regarding whether to interrupt, continue or change certain ion-implantation process parameters of one or more devices 10g, 10b, 10c, 10n in real time via local or remote computer monitoring.

In addition, maximum and minimum (top limit and lower limit) values may be predetermined so that an alarm is generated or a stop signal is transferred to the plurality of ion implantation devices 10a,10b, . . . ,10n through the multi-card 21 when the values are beyond the limits, thereby stopping the operation of the devices.

As described above, the plurality of ion implantation devices are connected to the multi-card. The local computer, also through the multi-card, can collect parameters corresponding to work results and device conditions to thereafter graphically or textually process them and store the result in a database. As a result, there is no need to print a hardcopy of the results via a printer, thereby reducing costs in checking the state of the devices. Moreover, an ion-implantation process may be remotely monitored in real time display of graphic or text operational data.

While the invention has been described in terms of preferred embodiments, those skilled in the art will recognize that the invention can be practiced with modification within the sprit and scope of the appended claims.

What is claimed is:

1. A system comprising:
   ion-implantation devices, each ion-implantation device having an output port;
   a local computer that includes a first monitor, configured to receive log data directly from the output port of each ion-implantation device, the log data related to parameters of an ion-implantation process, the local computer configured to concurrently convert the log data into text data and to graphically process the log data to produce graphic data, the local computer configured to store the text data and the graphic data in a database, and the local computer configured to display the text data and the graphic data using the first monitor.

2. The system of claim 1, wherein the local computer is adapted to separately collect log data output from said output ports of said ion implantation devices.

3. The system of claim 1, wherein the local computer comprises an interfacing multi-card, over which log data outputted from the plurality of ion implantation devices can be collected.

4. The system of claim 1, further comprising:
   a remote computer operative to collect graphic data and text data input from the local computer through a local-area network, and
   a second monitor coupled to said remote computer and adapted to display said graphic data and text data.

5. The system of claim 4, wherein the local computer and the remote computer are coupled to a local-area network.

6. The system of claim 5, wherein the remote computer comprises a local-area network card coupling the remote computer to a local-area network by utilizing a TCP/IP protocol.

7. A method of monitoring parameters during an ion implantation process, the method comprising:
   receiving process log data from a first ion implantation device when said first ion implantation device is engaged in the ion implantation process, the process log data received by a monitoring system that includes a local computer having coupled thereto a first monitor adapted to display graphic data and text data, the local computer including an interfacing multi-card and operative to convert the process log data to text data, and a plurality of ion implantation devices communicating with said local computer through the interfacing multi-card, the first ion implantation device belonging to the plurality of ion implantation devices;
   storing said process log data in chronological order with substantially contemporaneous updating during the ion implantation process;
   generating processed text data and processed graphic data from the stored process log data; and
   storing the processed test data and processed graphic data in a database for display to a user.

8. The method of claim 7, further comprising displaying the processed data.

9. The method of claim 8, wherein processing said collected log data is performed by a computer proximate said plurality of ion implantation devices.

10. The method of claim 8, wherein processing said collected log data is performed by a computer remote from said plurality of ion implantation devices.

11. The method of claim 10, wherein processed data in the database is accessed by the remote computer via a local-area network.

12. An article comprising a storage medium, said storage medium having stored thereon instructions that, when executed by a computing device, result in:
 receiving process log data from a first ion implantation device of a plurality of ion implantation devices when said first ion implantation device is engaged in an ion implantation process;
 storing log data collected from said first ion implantation device during said process, said log data stored in chronological order and updated substantially contemporaneously during said process;
 generating processed text data and processed graphic data from the stored log data; and
 storing the processed test data and processed graphic data in a database.

13. The article of claim 12, further comprising displaying the processed data.

14. The article of claim 13, wherein processing said collected log data is performed by a computer proximate said plurality of ion implantation devices.

15. The article of claim 13, wherein processing said collected log data is performed by a computer remote from said plurality of ion implantation devices.

16. The article of claim 15, wherein processed data in the database is accessed by the remote computer via a local-area network.

* * * * *